United States Patent
Pocker et al.

(10) Patent No.: US 6,969,447 B2
(45) Date of Patent: Nov. 29, 2005

(54) THIN FILM PROTECTIVE LAYER WITH BUFFERING INTERFACE

(75) Inventors: Daryl J. Pocker, San Jose, CA (US); Jan-Ulrich Thiele, Menlo Park, CA (US); Bond-Yen Ting, San Jose, CA (US); Richard Longstreth White, Los Altos, CA (US); Bing K. Yen, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 7 days.

(21) Appl. No.: 10/756,556

(22) Filed: Jan. 12, 2004

(65) Prior Publication Data

US 2004/0170871 A1 Sep. 2, 2004

Related U.S. Application Data

(62) Division of application No. 09/952,872, filed on Sep. 11, 2001, now abandoned.

(51) Int. Cl.⁷ .......................... C23C 14/34; B05D 1/18
(52) U.S. Cl. .......................... 204/192.16; 204/192.15; 204/192.12; 427/470; 427/432; 427/577
(58) Field of Search .................. 204/192.12, 192.15, 204/192.16; 427/470, 577, 402

(56) References Cited

U.S. PATENT DOCUMENTS

| | | | |
|---|---|---|---|
| 5,364,690 A | 11/1994 | Takahashi et al. | 428/212 |
| 5,773,124 A | 6/1998 | Ishikawa et al. | 428/141 |
| 5,808,832 A | 9/1998 | Chen et al. | 360/235.2 |
| 5,837,357 A * | 11/1998 | Matsuo et al. | 428/212 |
| 5,942,317 A | 8/1999 | White | 428/216 |
| 6,063,245 A | 5/2000 | Frach et al. | 204/192.15 |
| 6,069,769 A | 5/2000 | Dorius et al. | 360/235.6 |
| 6,086,730 A | 7/2000 | Liu et al. | 204/192.16 |
| 6,086,949 A | 7/2000 | Hwang et al. | 427/130 |
| 6,136,403 A | 10/2000 | Prabhakara et al. | 428/65.3 |
| 6,303,214 B1 | 10/2001 | Chour et al. | 428/212 |
| 6,330,131 B1 | 12/2001 | Nepela et al. | 360/234.5 |
| 6,565,718 B1 * | 5/2003 | Chour et al. | 204/192.15 |

* cited by examiner

*Primary Examiner*—Steven Versteeg
(74) *Attorney, Agent, or Firm*—G. Marlin Knight

(57) ABSTRACT

A method for sputtering a thin film protective layer with improved durability is disclosed. The method reduces kinetic energy of the ions of the overcoat material during the initial period of deposition to form a buffering interface which reduces the interpenetration of the atoms of the protective layer into the underlying film. In the method of the invention the sputtering of the overcoat preferably begins with zero (or very low) voltage applied to the underlying film resulting in minimal ion implantation in the underlying film. The "high energy" phase of the process begins with increases in the magnitude of the negative bias voltage applied to the underlying film. The higher energy imparted to ions in the plasma result in a denser and harder film being formed over the initial buffer layer. The protective layer preferably comprises carbon and nitrogen.

13 Claims, 2 Drawing Sheets

THIN FILM PROTECTIVE LAYER WITH BUFFERING INTERFACE

RELATED APPLICATION

This is a divisional application of an application bearing Ser. No. 09/952872 filed on Sep. 11, 2001 now abandoned.

FIELD OF THE INVENTION

The invention relates to thin film protective layers and to methods for the deposition of thin film protective layers and more particularly to films comprising carbon and nitrogen (CNx) and even more particularly to such films as used on magnetic thin film media.

BACKGROUND OF THE INVENTION

A typical prior art head and disk system 10 is illustrated in FIG. 1. In operation the magnetic transducer 20 is supported by the suspension 13 as it flies above the disk 16. The magnetic transducer 20, usually called a "head" or "slider," is composed of elements that perform the task of writing magnetic transitions (the write head 23) and reading the magnetic transitions (the read head 12). The electrical signals to and from the read and write heads 12, 23 travel along conductive paths (leads) 14A, 14B, 15A, 15B which are attached to or embedded in the suspension 13. The magnetic transducer 20 is positioned over points at varying radial distances from the center of the disk 16 to read and write circular tracks (not shown). The disk 16 is attached to a spindle 18 that is driven by a spindle motor 24 to rotate the disk 16. The disk 16 comprises a substrate 26 on which a plurality of thin films 21 are deposited. The thin films 21 include ferromagnetic material in which the write head 23 records the magnetic transitions in which information is encoded. The thin film protective layer (not shown in FIG. 1) is typically the last or outermost layer.

The conventional disk 16 typically has a substrate 26 of AlMg or glass. The thin films 21 on the disk 16 typically include a chromium or chromium alloy underlayer that is deposited on the substrate 26. The magnetic layer in the thin films 21 is based on various alloys of cobalt, nickel and iron. For example, a commonly used alloy is CoPtCr. However, additional elements such as tantalum and boron are often used in the magnetic alloy.

FIG. 2 illustrates one common internal structure of thin films 21 on disk 16. The protective overcoat layer 37 is used to improve wearability and corrosion. The materials and/or compositions which are optimized for one performance characteristic of an overcoat are rarely optimized for others. The most commonly used protective layer materials for commercial thin film disks have been carbon, hydrogenated carbon (CHx), nitrogenated carbon (CNx) and CNxHy. Efforts to optimize overcoat properties have included use of a layer structure using different materials and/or compositions for each of two or more layers in the overcoat structure. For example, U.S. Pat. No. 5,942,317 issued to R. White describes the use of a graded CHx protective layer wherein the hydrogen content is highest at the film's surface to take advantage of the lower polar surface energy characteristic of higher hydrogen levels (which improves corrosion resistance) and is lowest at the interface with the magnetic layer to optimize the adhesion properties. The midlevel of the CHx film is likewise optimized by having an intermediate hydrogen concentration which has a high hardness to improve wearability. The variations in the hydrogen content can be continuous or discrete. For example, a protective layer structure with three sublayers with lower hydrogen concentration nearest the magnetic layer, intermediate hydrogen concentration in the middle sublayer and high hydrogen concentration at the surface is suggested in White '317. Hardness and density are reduced by the presence of hydrogen in certain percentage ranges; thus, the overcoat structure of White '317 is hardest and densest at the interface with the magnetic layer.

In U.S. Pat No. 5,679,431 Chen, et al., describe the use of a bilayer protective overcoat in which the initial sublayer is carbon, titanium or chromium and the surface sublayer is CHx or CNx. The problem being addressed in Chen '431 is diffusion of nitrogen or hydrogen into the magnetic layer over time. The initial sublayer is intended to act as a diffusion barrier.

U.S. Pat. No. 6,086,730 to Liu, et al., describes a method for sputtering a carbon protective layer with a high $sp^3$ content which involves applying relatively high voltage pulses to the carbon target. Liu '730 asserts that the resulting carbon overcoat has good durability and corrosion resistance down to low thicknesses.

In order to improve the performance of magnetic thin film media the protective overcoat 37 must be made as thin as possible to reduce the separation from the magnetic transducer 20 and the magnetic thin film 33 while maintaining the protective function.

SUMMARY OF THE INVENTION

The applicants disclose a method for sputtering a protective layer which allows the protective layer to be ultra-thin with improved durability over prior art films. The method reduces the kinetic energy of the impinging ions during the initial period of deposition to form a buffering interface which reduces the interpenetration of the atoms of the protective layer into the underlying film. The lower energy ions form a less dense and softer film than do higher energy ions. In the method of the invention the sputtering of the overcoat preferably begins with zero (or very low) bias voltage applied to the underlying film. This "low energy" phase of the deposition results in minimal ion implantation in the underlying film. The "low energy" deposition continues only as long as it takes to form a buffer layer of the overcoat material on the underlying film. The buffer layer deposited in this phase is relatively soft and is, therefore, not sufficient for a complete overcoat. The "high energy" phase of the process begins with increases in the magnitude of the negative bias voltage applied to the underlying film. The higher energy imparted to ions in the plasma result in a denser and harder film being formed over the initial buffer layer. The initial buffer layer reduces the interpenetration of the higher energy ions into the underlying film. The protective layer preferably comprises carbon and nitrogen. The protective layer structure of the invention is preferably used over a magnetic layer on thin film magnetic media. The protective film produced by the method of the invention has a relatively lower density at the interface with the underlying film and a relatively higher density at the surface.

DETAILED DESCRIPTION OF THE INVENTION AND THE PREFERRED EMBODIMENTS

Figure 1:
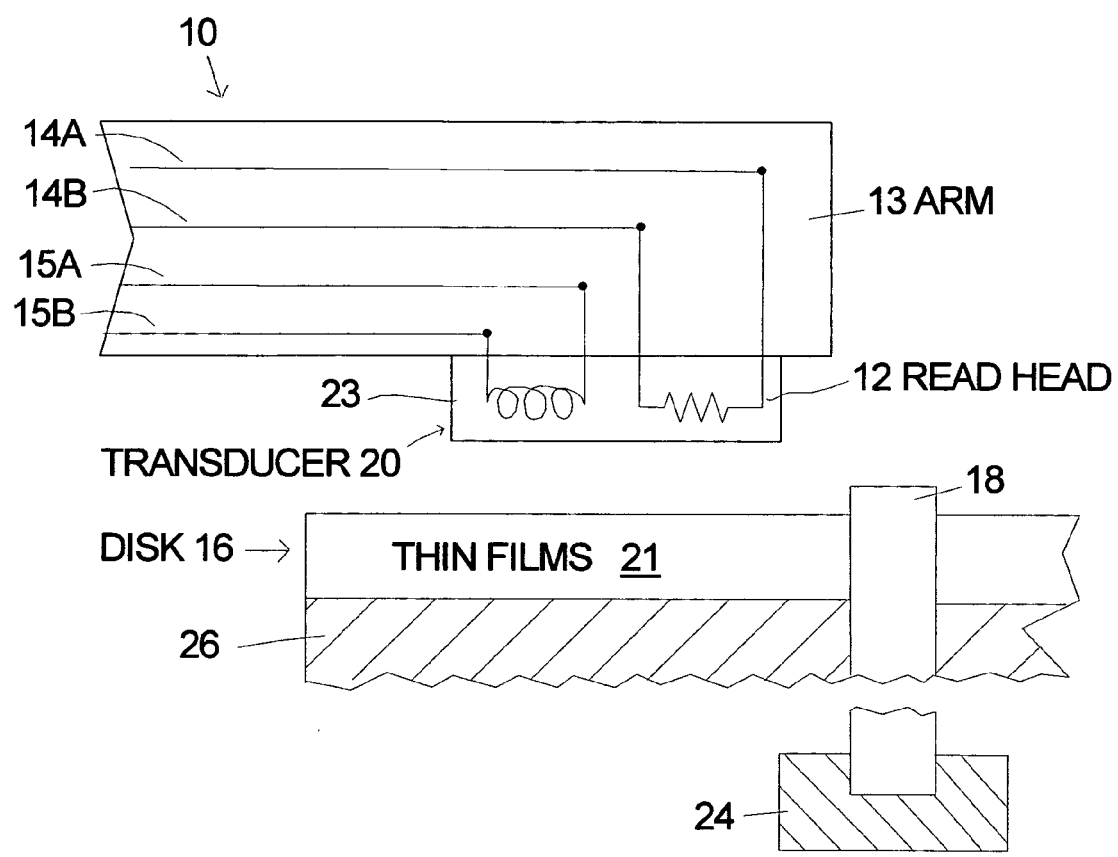
FIG. 1 is a symbolic illustration of the prior art showing the relationships between the head and associated components in a disk drive.
Figure 2:
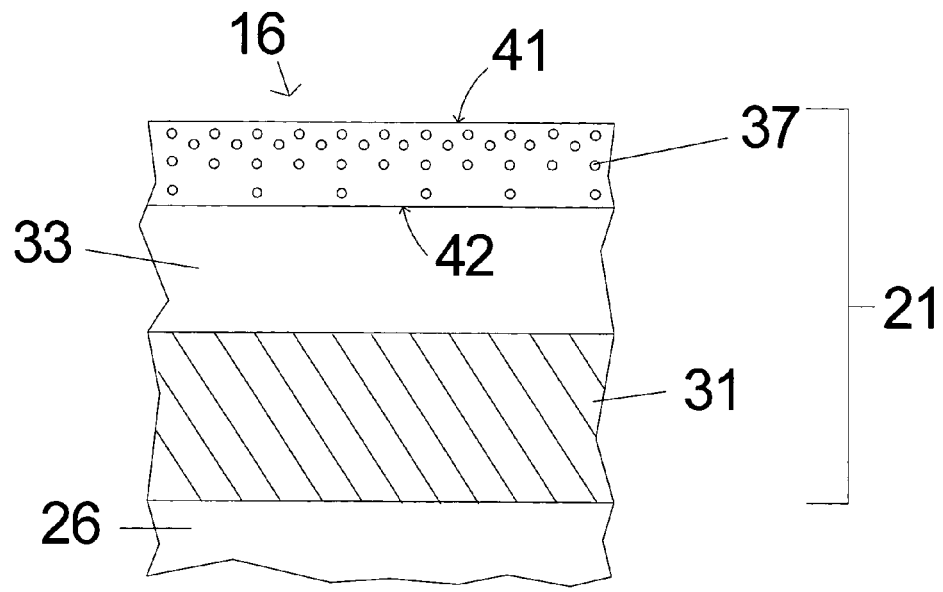
FIG. 2 is an illustration of a layer structure for a magnetic thin film disk according to the invention.

FIG. 2 illustrates a cross section of a magnetic thin film disk embodying the protective layer structure of the invention. The film structure illustrated contains only one magnetic layer 33 and one underlayer 31. However, the protective layer structure of the invention is not dependent on any particular underlying film structure so long as the final layer below the overcoat is conductive. The protective layer of the invention, therefore, may be used on any combination of multiple magnetic layers, underlayers and seed layers. The interface 42 between the magnetic layer 33 and the protective layer 37 is the region of the protective layer 37 that has the lowest density (indicated by the spacing of the small circles in the drawing) and the surface of the protective layer 41 has the highest density.

The preferred material for the protective layer 37 is CNx. Other elements such as hydrogen may be added to the film in relatively small atomic percentages. The preferred method of depositing the protective layer 37 of the invention is by sputtering using known techniques for forming a CNx film with the exceptions noted below. In the typical process for forming a CNx film a graphite target is used and nitrogen is introduced into the sputtering chamber as a gas. The relative concentration of nitrogen in the deposited film is controlled by modulating the partial pressure of the nitrogen gas in the chamber. Lower partial pressures of nitrogen result in lower concentrations of nitrogen in the film as would be expected. As is well known to those in the sputtering arts, the precise partial pressures of nitrogen and the working gas (typically argon) are derived empirically for each unique combination of equipment used in the sputtering process.

The preferred embodiment of the invention has from 5 to 25 at. % nitrogen in the protective layer. The preferred thickness of the protective layer is from 2 to 9 nanometers.

Figure 3:
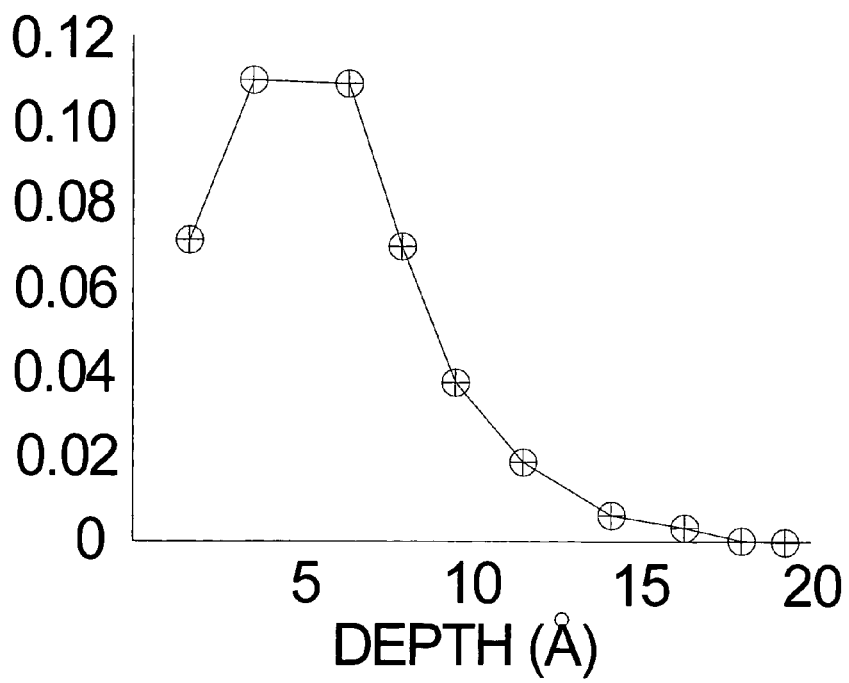
FIG. 3 is a graph of the anticipated distribution of the depth of 50 ev carbon ion implantation into a CoPtCr magnetic film.

The method of the invention includes modulating the bias voltage applied to underlying film. The use of negative bias voltages applied to metallic substrates is well known. The larger the magnitude of the voltage, the more kinetic energy is imparted to the positive ions as they are accelerated toward the substrate. Higher energy ions result in a denser, harder and smoother overcoat film due, at least in part, to resputtering effects. The higher energy ions also interpenetrate the underlying film to a greater depth than do lower energy ions. This interpenetration is considered to be negligible for many applications since the depth of penetration is small in comparison to the film thickness. However, in applications such as magnetic thin film media, the films are sufficiently thin that the interpenetration of atoms into the lattice of magnetic materials is undesirable. FIG. 3 is a graph of the anticipated distribution of the depth of 50 ev carbon ion implantation into a CoPtCr magnetic film. Using the method of the invention the initial bias voltage is essentially zero which reduces the average energy of the impinging ions to a few electron volts. The interpenetration of the overcoat atoms into the magnetic film is negligible at this energy level.

Moreover, for ultra-thin overcoats (for example, 0.5 to 2.5 nm) the performance of the overcoat depends critically on the nature of the interface with the underlying film. Although negative voltage bias improves the overcoat itself, it has been found by the applicants to degrade the interface for overcoats on the order of 2.5 nm thick.

In an experiment performed by the applicants, prior art sputtering techniques using −50 v bias were used to deposit 2.5 nm CNx overcoats on a batch of thin film magnetic disks. The disks were then subjected to the finishing and testing process that is normally used for large scale manufacturing of magnetic disks which includes burnishing the surface of the disks using special heads with leading edges designed to cut off the higher protrusions. To be commercially usable the overcoat on the disks must be able to withstand this burnishing and still present a surface to the slider of the magnetic transducer over which the slider can "fly" without excessive disturbance. In the experiment 85% of the prior art disks with 2.5 nm CNx overcoats failed to provide a flyable surface after burnishing, i.e., the usable yield was 15%.

A second batch of otherwise identical disks was prepared using the method of the invention to sputter 2.5 nm CNx overcoats. The particular sputtering setup required approximately four (4) seconds to deposit 2.5 nm of CNx. For the initial one (1) second, no voltage bias was applied to the underlying CoPtCr film. The underlying film was then subjected to −50 v dc bias for the remainder of the deposition. This second batch of disks was then burnished and tested for flyability. These disks passed the flyability test 87% of the time representing nearly a six-fold increase in yield over the prior art disks.

In the experiment described above the bias was rapidly switched from 0 to −50 v dc after the initial period in which the lower density CNx material for the buffering interface was formed. The bias can also be increased gradually, as long as the low and high density portions of the film are given adequate time to form. The preferred range of dc bias voltages for the high voltage period is from −50 v to −400 v.

The method of the invention can also be used with dual cathode pulsed sputtering techniques. With this technique the pulsing of opposing targets provides considerable ion bombardment of the films deposited on grounded substrates, therefore, for this embodiment the preferred bias voltages are in the range of 0 (ground) to −200 v.

Applying bias to disks with conductive substrates such as the NiP coated AlMg substrates is a straightforward process. The edges of the disk are held during sputtering by conductive material to which the bias voltage is applied. Whether the points of electrical contact are blocked or shadowed during the deposition is irrelevant since the substrate itself is conductive. However, for nonconductive substrates such as glass the bias voltage must be applied to a conductive film on the disk, so shadowing must be taken into account. There are several different types of mechanical systems used to load and support disks while they are being sputtered. Regardless of what type of system is being used, the contact points for delivery of the bias voltage to the conductive film on which the protective layer of the invention is to be formed must not have been shadowed during the deposition of the conductive film(s). This condition is satisfied if the disk is held at different points during the deposition of the overcoat other than the points at which the disk was held during the deposition of the conductive film. A small rotation of the disk after the deposition of the conductive film is sufficient to move the contact points to locations where the conductive has been adequately formed. Since the magnetic thin films in question are on the order of ten's of nanometers thick care must be taken not to overheat the thin film through which the bias current flows.

The atomic percent compositions given above are given without regard for the small amounts of contamination that invariably exist in sputtered thin films as is well known to those skilled in the art.

The invention has been described with respect to use on thin film magnetic disks, but other uses and applications which can benefit from the properties of the protective layer structure of the invention will be apparent to those skilled in the art.

What is claimed is:

1. A method of depositing thin films comprising the steps of;
    depositing a conductive, ferromagnetic thin film layer on an article;
    depositing a buffer layer on the conductive, ferromagnetic thin film layer comprising carbon and nitrogen while applying a bias voltage from zero to a first negative voltage applied to the conductive, ferromagnetic thin film layer for a first time period;
    changing the bias voltage to a second negative voltage, the second negative voltage being greater in magnitude than the first negative voltage; and
    depositing a thin film layer comprising carbon and nitrogen on the buffer layer while the bias voltage is the second negative voltage for a second time period.

2. The method of claim 1 wherein the step of depositing the thin film layer comprising carbon and nitrogen further comprises using a dual cathode pulsed sputtering technique.

3. The method of claim 1 wherein the step of depositing a conductive, ferromagnetic thin film layer further comprises holding the article at a first set of points while depositing the conductive, ferromagnetic thin film layer and the step of depositing a thin film layer comprising carbon and nitrogen further comprises applying bias voltage through a second set of points different from the first set of points while depositing the thin film layer comprising carbon and nitrogen.

4. The method of claim 3 further comprising the steps of rotating the article after depositing the conductive, ferromagnetic thin film layer and before depositing the buffer layer.

5. The method of claim 1 wherein the second negative voltage is a dc voltage from −50 v to −400 v.

6. The method of claim 1 wherein the second negative voltage is a pulsed voltage from zero to −400 v.

7. The method of claim 1 wherein the step of depositing a thin film layer comprising carbon and nitrogen continues until a thickness of material comprising carbon and nitrogen is from 0.5 to 9 nm.

8. The method of claim 1 wherein the second time period is longer than the first time period.

9. The method of claim 1 wherein the second time period is approximately four times as long as the first time period.

10. The method of claim 1 wherein a combined thickness of the buffer layer and the thin film layer comprising carbon and nitrogen is from 0.5 to 9 nm, the second negative voltage is a dc voltage from −50 v to −400 v and the method further comprises the step of applying the second negative voltage to the conductive, ferromagnetic thin film layer at one or more points where the conductive, ferromagnetic thin film layer was not subject to shadowing during deposition.

11. A method of depositing a protective thin film on an article comprising the steps of:
    depositing a conductive, magnetic thin film while holding the article at a first set of points;
    depositing a buffer layer on a conductive thin film layer, the buffer layer comprising carbon and nitrogen and being deposited using ions with a first average kinetic energy while holding the article at a second set of points; and
    depositing a thin film layer comprising carbon and nitrogen onto the buffer layer using ions with a second average kinetic energy.

12. The method of claim 11 further comprising the steps of rotating the article after depositing the conductive, ferromagnetic thin film layer and before depositing the buffer layer.

13. The method of claim 11 wherein a combined thickness of the buffer layer and the thin film layer comprising carbon and nitrogen is from 0.5 to 9 nm.

* * * * *